(12) United States Patent
Totzeck et al.

(10) Patent No.: US 7,535,640 B2
(45) Date of Patent: May 19, 2009

(54) IMAGING SYSTEM FOR EMULATION OF A HIGH APERTURE SCANNING SYSTEM

(75) Inventors: Michael Totzeck, Schwaebisch Gmuend (DE); Ulrich Stroessner, Jena (DE); Joern Greif-Wuestenbecker, Jena (DE)

(73) Assignee: Carl Zeiss SMS GmbH, Jena (DE)

( * ) Notice: Subject to any disclaimer, the term of this patent is extended or adjusted under 35 U.S.C. 154(b) by 91 days.

(21) Appl. No.: 10/923,551

(22) Filed: Aug. 20, 2004

(65) Prior Publication Data
US 2006/0007541 A1 Jan. 12, 2006

(30) Foreign Application Priority Data
Jul. 8, 2004 (DE) .................. 10 2004 033 602

(51) Int. Cl.
*G02B 27/28* (2006.01)
(52) U.S. Cl. .................. 359/489; 359/501; 356/364; 250/225
(58) Field of Classification Search ............. 359/489, 359/501
See application file for complete search history.

(56) References Cited
U.S. PATENT DOCUMENTS 4,904,085 A * 2/1990 Spillman, Jr. et al. ....... 356/364
6,163,367 A * 12/2000 Obszarny .................. 355/53
6,657,736 B1 12/2003 Finaroy et al.
7,286,284 B2 * 10/2007 Totzeck et al. ............. 359/363
2002/0154303 A1 10/2002 Maeda et al.
2004/0085539 A1 5/2004 Opsal
2004/0125373 A1 * 7/2004 Oldenbourg et al. ........ 356/364
2006/0192937 A1 * 8/2006 Kerkhof et al. ............. 355/71

FOREIGN PATENT DOCUMENTS
DE 10304822 2/2004

* cited by examiner

Primary Examiner—Amel C Lavarias
(74) Attorney, Agent, or Firm—Reed Smith LLP

(57) ABSTRACT

An optical imaging system for inspection microscopes with which lithography masks can be checked for defects particularly through emulation of high-aperture scanner systems is provided. The imaging system for emulating high-aperture scanner systems includes imaging optics, a detector and an evaluating unit, wherein at least one polarization-active optical element is arranged as desired in the imaging beam path for selection of different polarization components of the imaging beam, an optical element with intensity attenuation function can be introduced in the imaging beam path, images of the mask and/or sample are received by the detector for differently polarized beam components and are conveyed to the evaluating unit for further processing. It is possible to examine lithography masks for defects in spite of increasingly smaller structures and increasingly higher image-side numerical apertures of the imaging systems Realistic images of the stepper systems can be generated by emulating the occurring vector effects.

8 Claims, 4 Drawing Sheets

Figure 6
High-NA-imaging system
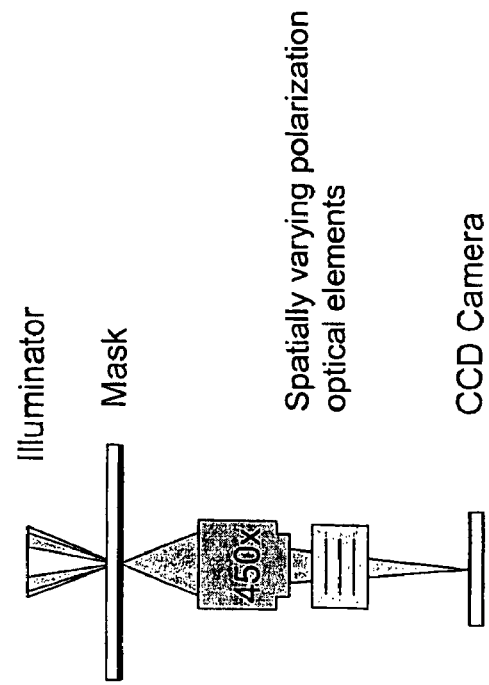
3 orthogonal E-field directions
Figure 7
Emulation system
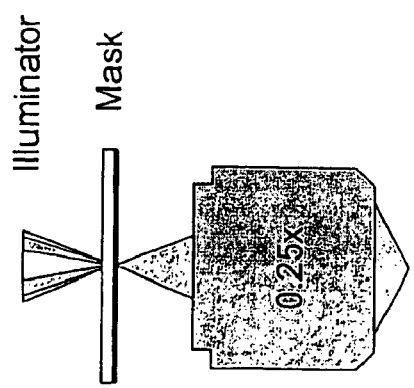
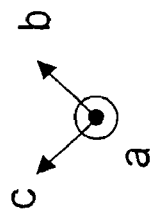

IMAGING SYSTEM FOR EMULATION OF A HIGH APERTURE SCANNING SYSTEM

CROSS-REFERENCE TO RELATED APPLICATION

This application claims priority of German Application No. 10 2004 033 602.4, filed Jul. 8, 2004.

BACKGROUND OF THE INVENTION a) Field of the Invention

The present invention is directed to an optical imaging system for inspection microscopes with which lithography masks can be checked for defects particularly through emulation of high-aperture scanner systems for semiconductor lithography.

b) Description of the Related Art

As object structures continue to decrease in size, increasingly higher image-side numerical apertures of scanner systems are required. However, the incident angles which are therefore also increasingly greater result in vector effects, as they are called, in which tangentially polarized and radially polarized beam components have different intensity curves. It has been shown that the beam components which oscillate perpendicular to the incident plane defined by the incidence direction and the surface normal of the substrate (s-polarized) interfere and accordingly generate a sharper contrast than the beam components oscillating parallel thereto (p-polarized). These vector effects lead to a decreasing contrast for p-polarized components of radiation and, therefore, to a decreasing total contrast in scanner systems with high image-side numerical apertures.

The following description is based on this definition: Light is a transverse electromagnetic wave whose field oscillates perpendicular to the propagation direction. Light whose field vector E oscillates in only one direction is called linearly polarized light. The polarization direction is the direction in which the field vector E oscillates. The incident beam and reflected beam define the incident plane lying perpendicular to the interface of the two media. Light whose polarization plane lies perpendicular to the incident plane is called s-polarized light and light whose polarization plane lies parallel to the incident plane is called p-polarized light.

Tangential (s-) polarization is present when the light in the pupil of an optical system is linearly polarized and the polarization direction changes along the pupil so that the polarization direction is tangential to the optical axis (perpendicular to the radius vector) at every point of the pupil. In contrast, radial (p-) polarization is present when the polarization direction is radial to the optical axis (parallel to the radius vector) at every point in the pupil.

The current direction of the semiconductor industry favors the use of immersion systems for producing wafer structures smaller than 65 nm. Image-side numerical apertures of NA>1 are achieved by applying an immersion liquid to the wafer, so that smaller structures can be imaged and accordingly generated at the same wavelength. Since the mask structures are therefore in the range of the imaging wavelength, the polarization effects due to the masks are also increasingly dominant.

When imaging a lithography mask through scanner systems, these p-polarized beam components are imaged differently than they are through an inspection microscope. Due to the magnified imaging of the lithography mask on a CCD matrix, the image-side numerical aperture is extremely small, so that vector effects do not occur. When a microscope is used to inspect lithography masks by emulating a scanner system, the occurring vector effects are absolutely necessary for observing the lithography mask because a real image of the scanner system cannot otherwise be emulated.

In the inspection microscopes known from the prior art, vector effects were not taken into consideration because the numerical apertures of the imaging systems that were used were less than 1 and vector effects therefore led to a minor error.

Therefore, the analysis of defects in the mask production process is increasingly important with smaller structures. For the last ten years, AIMS™ (Aerial Imaging Measurement System) by Carl Zeiss SMS GmbH has been commercially available for the analysis of mask defects with respect to printability. For this purpose, a small area of the mask (defect location) is illuminated and imaged under the same conditions of illumination and imaging (wavelength, NA, sigma, polarization) as with the lithographic scanner. In contrast to the scanner, however, the aerial image generated by the mask is magnified on a CCD camera. The camera sees the same image as the resist on the wafer. Therefore, the aerial image can be analyzed without wasteful test prints. Additional information for the analysis of the lithographic process window is obtained by taking a focus series.

While the lithography scanner images the mask structure in a reduced manner on the medium to be exposed, the structure is imaged in a magnified manner on a detector in mask inspections. The mask-side numerical aperture is the same in both systems.

According to the prior art, the image-side differences between the scanner and the emulation microscope are minor. As the image-side numerical aperture of the scanner increases, this difference increases and can no longer be ignored. This effect occurring in scanner imaging is called the vector effect.

OBJECT AND SUMMARY OF THE INVENTION

It is the primary object of the present invention to develop a solution for lithography mask inspection microscopes for scanner emulation which makes it possible to emulate the images of lithography scanner systems also with an image-side numerical aperture of greater than one.

According to the invention, this object is met by an imaging system for emulating high-aperture imaging systems which comprises imaging optics, a detector and an evaluating unit. At least one polarization-active and/or intensity-attenuating optical element is arranged as desired in an imaging beam path for selecting different polarization components of the imaging beam. Images of the mask and/or sample are received by the detector for differently polarized beam components and are conveyed to the evaluating unit for further processing By means of the proposed solution, it is possible to examine lithography masks for defects in spite of increasingly smaller structures and increasingly higher image-side numerical apertures of the imaging systems by means of inspection microscopes with high magnifications. Realistic images of the scanner systems can be generated by emulating the occurring vector effects.

The proposed solution is also applicable in other optical systems in which the characteristics of high-aperture imaging optics are to be emulated by low-aperture imaging optics in order to observe and/or taken into account corresponding effects.

The invention will be described more fully in the following with reference to embodiment examples.

BRIEF DESCRIPTION OF THE DRAWINGS

In the drawings:

FIG. 6 illustrates the High-NA-imaging system; and

FIG. 7 illustrates the emulation system according to the present invention.

DESCRIPTION OF THE PREFERRED EMBODIMENTS

Figure 5:
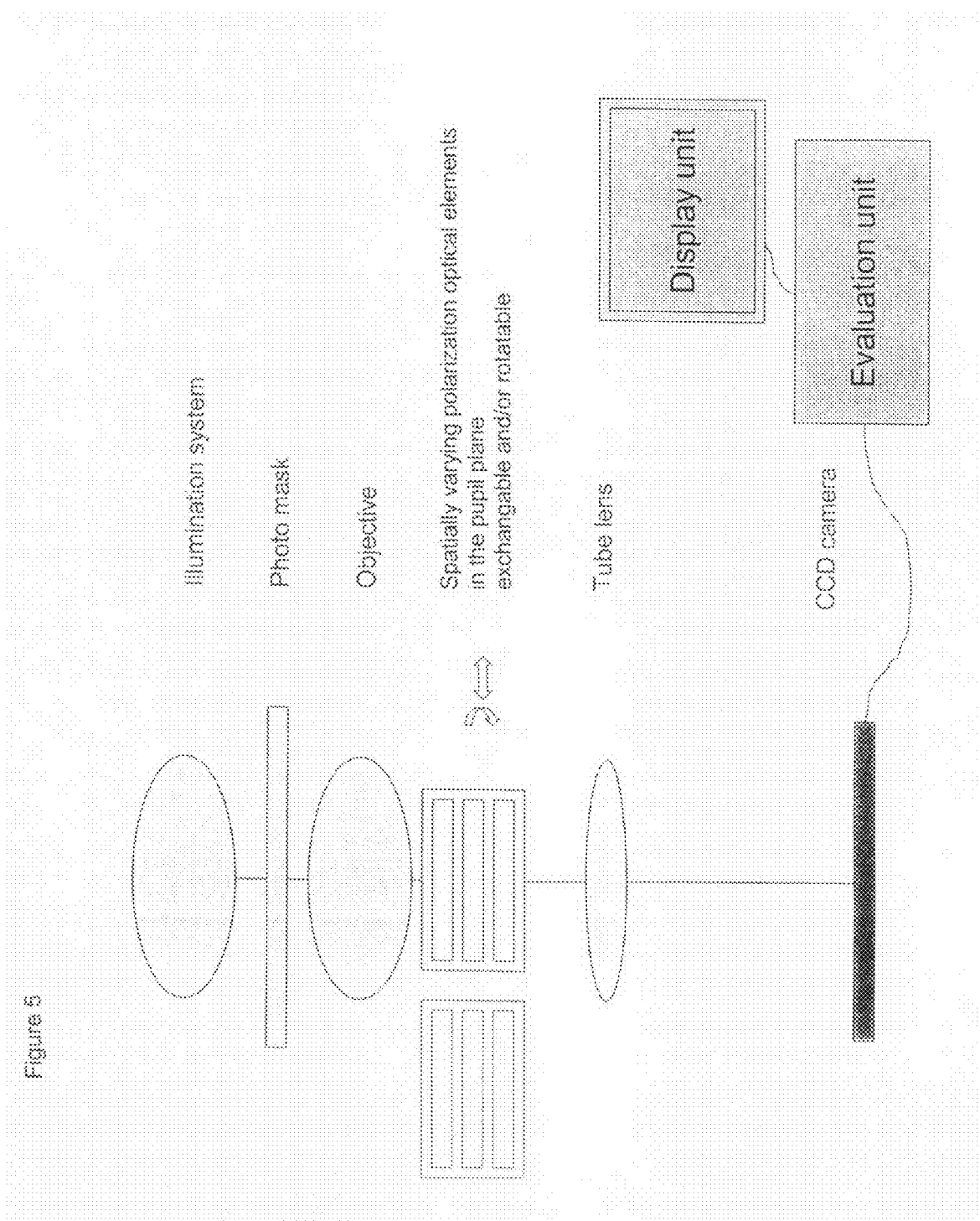
FIG. 5 illustrates the imaging system of the present invention.

The microscope imaging system, according to the invention, for emulating high aperture imaging systems, particularly for mask inspection, comprises imaging optics, a detector, and an evaluating unit. Polarization-active optical elements for generating different polarization states of the illumination beam are selectively arranged in the illumination beam path and/or in the imaging beam path for selection of different polarization components of the imaging beam. An optical element with a polarization-dependent intensity attenuation function can be introduced in the imaging beam path. Images of the mask and/or sample are received by the detector for differently polarized beam components. The images for differently polarized beam components are subsequently combined by an evaluating unit to form a total image. (See FIG. 5). This is carried out, for example, by summing their intensity distributions.

The two-dimensional E-field in the pupil generates a three-dimensional E-field distribution with components in the x-, y- and z-direction due to the high numerical aperture in the image field of the scanner. The x-, y- and z-components do not interfere with one another in the scanner because they extend orthogonally.

The polarization-optical elements comprise either a polarizer with orientation changing over the surface, a spatially-dependent attenuator and a spatially dependent rotator or a spatially dependent rotator, a spatially dependent attenuator and a linear polarizer.

The polarization-optical elements select the components of the E-field that generate an E-field oriented in a determined direction in the image of the high-aperture system.

In the solution described herein, three polarization-optical elements, for example, are alternately introduced near the pupil or in the vicinity of a conjugate image plane of the inspection microscope. They are configured in such a way that they select components from the two-dimensional E-field in the pupil that generate an E-field in x-direction, y-direction or z-direction in the image plane of the scanner. These are introduced successively in a plane near the imaging pupil of the inspection microscope. The components of the E-field are preferably oriented in parallel within the image field plane for their interference capability.

In this case, each of these three elements comprises a linear polarizer whose polarization direction changes in a suitable manner over the location, a spatially-dependent, polarization-independent attenuator, and a spatially dependent rotator which directs the differently oriented beam components in parallel.

The E-field directions of the components of the E-fields selected by the polarization-optical elements preferably lie parallel and perpendicular to the optical axis, or the projection of two or three of these directions on the optical axis has the same amount.

In this embodiment example, the rotator must be arranged after the polarizer; the attenuator can be arranged in front of, between, or behind the two other elements.

Figure 1:
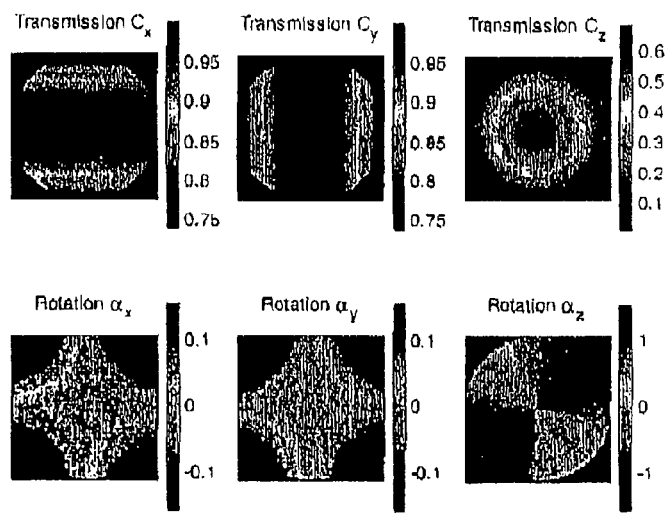
FIG. 1 shows the transmission of the attenuator and the orientation of the polarizer of the three elements for a numerical aperture of 1.2.

Using the example of a numerical aperture of 1.2, FIG. 1 shows the transmission of the attenuator via the pupil in the upper row for the three elements and, in the lower row, the orientation of the polarizer in units of rad, which at the same time also shows the rotation of the rotator.

The x-component and y-component are represented by an x-polarizer and y-polarizer that are attenuated along the x-axis and y-axis. The rotation and the necessary angle of rotation are extremely small. Therefore, the two elements can be realized in a good approximation at least for this NA already by a linear polarizer in combination with a gray filter. (See FIG. 6)

Figure 2:
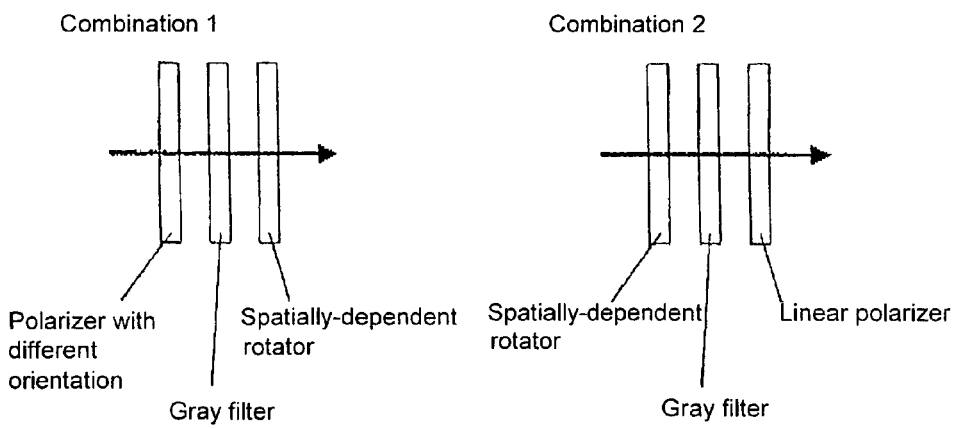
FIG. 2 shows two possible combinations for the arrangement of the three elements.

In another arrangement for the realization of these three elements, a spatially dependent rotator followed by a linear polarizer is used. The attenuator can again be arranged in front of, between, or behind the two other elements. FIG. 2 shows two combinations for the possible arrangement of the three elements.

The z-component is generated in combination 1 from a radial polarizer which is attenuated toward the center. The following rotator rotates the radial polarization parallel again so that all of the pupil points can interfere with one another. In combination 2, on the other hand, the polarizer comprises only a linear polarizer which is attenuated toward the outside.

At least one image is taken with each of the three elements. These three images are subsequently further processed, e.g., summed, by the evaluating unit. The vector effects can accordingly be exactly emulated.

In a simplified arrangement, the rotation and the variation of the orientation of the polarizer, which is very small, may be ignored for the x- and y-components. The errors which result from this omission can be minimized by additional recording of images for the diagonal components (1/sqrt(2)*(x+y) and 1/sqrt(2)*(x−y)).

In another arrangement, the polarization-optical elements are constructed in such a way that they select the E-field components in the a-, b- and c-direction instead of in the x-, y- and z-direction. In this case, a, b and c must lie orthogonal to one another in pairs. They can proceed from x, y and z through any three-dimensional rotation.

In a particularly advantageous construction, two or three identical polarization-optical elements are used which can be rotated to different angular positions. For example, a, b and c can be selected as:

$$a = \begin{pmatrix} 1 \\ 0 \\ 0 \end{pmatrix}, b = \begin{pmatrix} 0 \\ \sqrt{1/2} \\ \sqrt{1/2} \end{pmatrix}, c = \begin{pmatrix} 0 \\ -\sqrt{1/2} \\ \sqrt{1/2} \end{pmatrix}$$

or $$a = \begin{pmatrix} \sqrt{2/3} \\ 0 \\ \sqrt{1/3} \end{pmatrix}, b = \begin{pmatrix} -\sqrt{1/6} \\ \sqrt{1/2} \\ \sqrt{1/3} \end{pmatrix}, c = \begin{pmatrix} -\sqrt{1/6} \\ -\sqrt{1/2} \\ \sqrt{1/3} \end{pmatrix}$$

Figure 3:
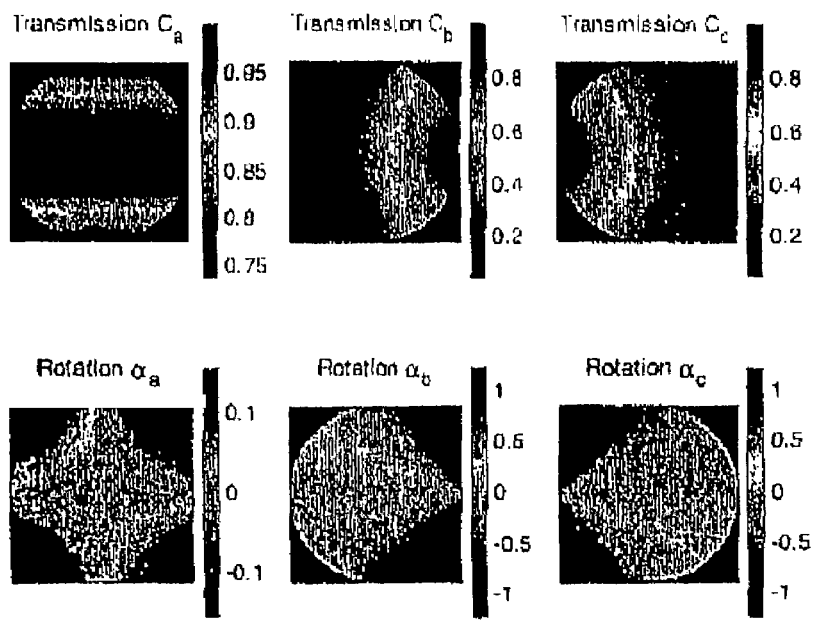
FIG. 3 shows the transmission and rotation for an example with two identical structural component parts for a numerical aperture of 1.2.
Figure 4:
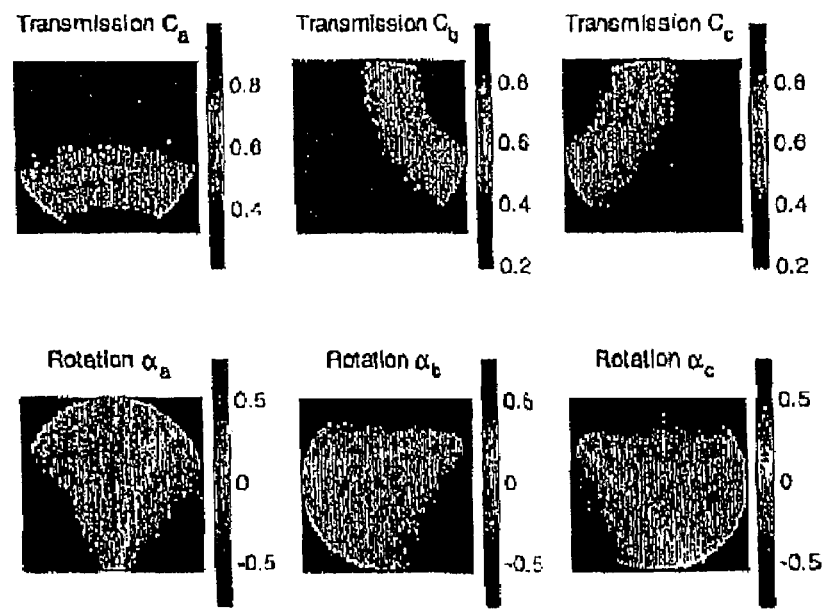
FIG. 4 shows the transmission and rotation for an example with three identical structural component parts for a numerical aperture of 1.2.

FIGS. 3 and 4 show the transmission and rotation for this selection of a, b and c and the example of a numerical aperture of 1.2.

In the first case and second case, two component parts are identical; in the last case, all three are identical. Accordingly, one element which is arranged so as to be rotatable is sufficient.

If errors occur because the action of the elements deviates from the ideal, these errors can be reduced by using elements for more than three directions. For example, this can be implemented in a simple manner in the last selection of a, b, and c in that one component part is rotated to more than three different angles. Any errors can be reduced by recording more than three images by the corresponding selection of directions of the selected E-fields. (See FIG. 7)

The imaging system according to the invention for emulating high-aperture scanner systems offers a solution in which only one optical element which is positioned in different angular positions in the beam path is required for the emulation of vector effects While the foregoing description and drawings represent the present invention, it will be obvious to those skilled in the art that various changes may be made therein without departing from the true spirit and scope of the present invention.

The invention claimed is:

1. An imaging system for emulating high-aperture imaging systems, comprising:
    imaging optics;
    a detector coupled to the imaging optics;
    an evaluating unit coupled to the detector; and
    at least one polarization-active and intensity-attenuating optical element arranged in an imaging beam path between the detector and a mask, the at least one polarization-active and intensity-attenuating optical element selecting different polarization components of the imaging beam;
    wherein images of the mask are received by the detector for differently polarized beam components and are conveyed to the evaluating unit for further processing; and
    wherein the polarization-active and intensity-attenuating optical element is arranged near a pupil or in the vicinity of a conjugate image plane.

2. The imaging system according to claim 1, wherein the at least one polarization-active and intensity-attenuating optical element comprises a polarizer with spatially changing orientation, a spatially-dependent attenuator and a spatially dependent rotator.

3. Imaging system according to at least one of claim 1, wherein the at least one polarization-active and intensity-attenuating optical element comprises a spatially dependent rotator, a spatially dependent attenuator and a linear polarizer.

4. The imaging system according to claim 1, wherein the at least one polarization-active and intensity-attenuating optical element selects the components of the E-field that generate an E-field oriented in a determined direction in the image of the high-aperture system.

5. The imaging system according to claim 4, wherein the E-field directions of the components of the E-fields in the high-aperture system selected by the polarization-active and intensity-attenuating optical elements lie parallel and perpendicular to the optical axis, or the projection of two or three of these directions on the optical axis has the same amount.

6. The imaging system according to claim 1, wherein a plurality of polarization-active and intensity-attenuating optical elements are used, whose selected E-field directions lie orthogonal to one another in the image of the high-aperture system.

7. The imaging system according to claim 1, wherein one or two different polarization-active and intensity-attenuating optical components are used, at least one of which is rotated to different angular positions.

8. The imaging system according to claim 7, wherein more than three images are recorded in which the E-field directions of the components of the E-fields selected by the polarization-active and intensity-attenuating optical elements are selected in such a way that any errors are reduced.

* * * * *